United States Patent
Guzman et al.

(10) Patent No.: US 6,769,444 B2
(45) Date of Patent: Aug. 3, 2004

(54) MICROFLUIDIC DEVICE AND MANUFACTURE THEREOF

(75) Inventors: Guillaume Guzman, Veneux-les-Sablons (FR); Jean-Pierre Themont, Montigny sur Loing (FR)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/454,985

(22) Filed: Jun. 4, 2003

(65) Prior Publication Data

US 2003/0192587 A1 Oct. 16, 2003

Related U.S. Application Data

(63) Continuation of application No. 10/163,215, filed on Jun. 4, 2002, now Pat. No. 6,595,232.

(30) Foreign Application Priority Data

Sep. 28, 2001 (FR) .............................................. 01 12500

(51) Int. Cl.[7] .................................................. F15C 1/06
(52) U.S. Cl. ...................... 137/15.01; 137/13; 137/833; 137/334; 204/451; 204/601
(58) Field of Search .............................. 137/15.01, 13, 137/833, 334; 204/451, 601

(56) References Cited

U.S. PATENT DOCUMENTS

| | | | |
|---|---|---|---|
| 3,587,607 A | * | 6/1971 | Konig et al. ................. 137/833 |
| 4,110,140 A | * | 8/1978 | Laakaniemi et al. ......... 137/833 |
| 5,853,446 A | * | 12/1998 | Carre et al. .................... 65/17.3 |
| 5,904,424 A | | 5/1999 | Schwesinger et al. ....... 366/336 |
| 6,210,986 B1 | | 4/2001 | Arnold et al. ................. 438/42 |
| 2002/0001695 A1 | | 1/2002 | Tajima et al. ................ 428/138 |

FOREIGN PATENT DOCUMENTS

| | | |
|---|---|---|
| EP | 0870541 | 10/1998 |
| WO | WO91/16966 | 11/1991 |

* cited by examiner

*Primary Examiner*—A. Michael Chambers
(74) *Attorney, Agent, or Firm*—Gregory V. Bean

(57) ABSTRACT

The present invention relates to microfluidic devices and to their method of manufacture. The microfluidic devices are original by their specific structure (of sandwich type) and by the materials from which they are made (mainly glasses, glass ceramics, ceramics), and also by their specific method of manufacture, which is based on a vacuum-forming operation. The microfluidic device includes a first assembly including a microstructure and a first substrate, wherein the microstructure is constructed and arranged on the substrate under vacuum. A second assembly includes a second substrate positioned on the microstructure after the first assembly is presintered and adhered thereto by heat treatment to form a one-piece microstructure defining at least one recess between the first and second substrates.

11 Claims, 3 Drawing Sheets

MICROFLUIDIC DEVICE AND MANUFACTURE THEREOF

CROSS-REFERENCE TO RELATED APPLICATIONS

This application is a continuation of co-pending U.S. patent application Ser. No. 10/163,215 filed on Jun. 4, 2002, now U.S. Pat. No. 6,595,232 the content of which is relied upon and incorporated herein by reference in its entirety, which claims the benefit of French Patent Application No. 01 12500, filed on Sep. 28, 2001, in the names of Guillermo Guzman and Jean-Pierre Themont, the entire content of which is incorporated herein by reference, and the benefits of priority under 35 U.S.C. § 119 and § 120 are hereby claimed.

BACKGROUND OF THE INVENTION

1. Field of the Invention

The present invention relates generally to: the field of microreactors and more particularly to a microfluidic device and a method of manufacturing such microfluidic devices.

2. Technical Background

Microfluidic devices are structures familiar to those skilled in the art, structures for which numerous applications have already been described, in particular in references such as: Microreaction Technology, 3$^{rd}$ International Conference on Microreaction Technology; edited by W. Ehrfeld, published by Springer-Verlag, Berlin (2000); and Micro-total Analysis Systems 2000, edited by A. Van Den Berg, W. Olthius, and P. Bergveld, published by Kluwer Ac Publishers (2000). Within such structures, in volumes that are small (having a characteristic dimension that generally lies in the range of 10 micrometers ($\mu$m) to 1000 $\mu$m), fluids are directed and/or mixed together and/or caused to react.

Such devices known in the art include, microfluidic devices made of various types of material, and in particular of polymers, of silicon, or of metals. The shortcomings encountered with those materials are numerous. For example, devices made of polymers cannot withstand temperatures of more than 200° C. to 300° C. over a prolonged period. Moreover, it is often difficult to control surface states effectively within such structures.

Silicon devices are expensive, incompatible with certain biological fluids, and the semiconductive nature of silicon gives rise to problems with implementing certain pumping techniques, such as electro-hydrodynamic pumping and electro-osmotic pumping.

Devices made of metal are liable to corrode, and in like manner they are typically not compatible with certain biological fluids.

It has therefore been found desirable, in numerous contexts, to have fluidic microstructures made of glass, glass ceramic, or ceramic. Those materials are particularly appreciated for their insulating nature (thus, U.S. Pat. No. 6,210, 986 describes the benefit of having insulating structures available when the fluid is moved by electro-osmosis or by electrokinetics), for their resistance or even inertness in the face of chemical attack, for their transparency, for their surface homogeneity, and for the ease with which their surfaces can be modified chemically. Microfluidic devices made of glass have been obtained by chemical or physical etching. Those etching technologies give rise to hollows in a glass substrate and they are not entirely satisfactory to implement. Isotropic chemical etching does not enable significant aspect ratios to be obtained, while physical etching is difficult to implement, in particular because of its high cost and limited production capacity. To close such open structures, the technique most often employed is ionic attachment. That technique is expensive, and difficult to implement insofar as it is highly sensitive to dust and insofar as the surface of each layer that is to come into contact must be as flat as possible in order to provide high quality sealing.

Microfluidic devices made of ceramic, as described in European patent application No. EP-A-0 870 541, generally are obtained by ceramizing a stack of ceramizable layers (green mixture of ceramic powders and an organic binder). In the stack, there is no support layer, and within each ceramizable layer the empty volume remains limited.

In another context, that of screens and digital displays, the following techniques have been described. Generally speaking, glass forming operations to generate rectilinear parallel ribs on a flat support are known in the art. Unlike the method of the present invention, such forming steps are not performed in a vacuum. Known techniques are well represented in U.S. Pat. No. 5,853,446.

Operations for closing open plane structures having rectilinear parallel ribs, such as those obtained by the above-mentioned forming operations are also known. In accordance with such forming operations, a fine layer of glass paste is placed on these ribs, which are not too far apart. This is described in Japanese application No. JP-A-12 187 028. The technique incorporating the fine layer of glass cannot in any way be considered to be equivalent to the support substrate of devices made in accordance with the present invention.

What is needed therefore, but presently unavailable in the art, is a microfluidic device and method of manufacturing such a microfluidic device that overcomes these and other shortcomings associated with the use and manufacture of microfluidic devices known in the art. Such microfluidic devices should be capable of obtaining high aspect ratios, and should be well suited for use as microreactors for the chemical, pharmaceutical, and biotechnology industries. The method of manufacturing such microfluidic devices should be compatible with low cost production while at the same time provide advantageous yields. It is to the provision of such a microfluidic device and method of manufacturing such microfluidic devices that the present invention is primarily directed.

SUMMARY OF THE INVENTION

One aspect of the present invention relates to a microfluidic device. The microfluidic device includes a first assembly including a microstructure and a first substrate, wherein the microstructure is constructed and arranged on the substrate under vacuum. A second assembly including a second substrate is positioned on the microstructure after the first assembly is presintered and adhered thereto by heat treatment to form a one-piece microstructure defining at least one recess between the first and second substrates.

In another aspect the present invention is directed to a method of manufacturing a microfluidic device. The method includes the steps of disposing a mixture including an organic binder and a precursor material between a mold and a first substrate, heating the mixture under vacuum at a temperature sufficient to thermoform the mixture onto the first substrate and in the shape of the mold, and presintering the thermoformed mixture in the substrate to form a consolidated first assembly. The first assembly is assembled with a second assembly including a second substrate such that the presintered thermoformed mixture is positioned between the first presintered substrate and the second assembly. The assembled first assembly and second assembly is heated to a temperature sufficient to form a one-piece microstructure defining at least one recess between the first and second substrates.

The microfluidic device and method of manufacturing such microfluidic devices results in a number of advantages over other microfluidic devices and manufacturing techniques known in the art. For example, the vacuum-forming aspect of the present invention is a technique that is compatible with low-cost production and significant yield. In addition, vacuum-forming enables high aspect ratios without the use of expensive techniques such as physical etching.

Additional features and advantages of the invention will be set forth in the detailed description which follows and in part will be readily apparent to those skilled in the art from that description or recognized by practicing the invention as described herein.

It is to be understood that both the foregoing general description and the following detailed description are merely exemplary of the invention, and are intended to provide an overview or framework for understanding the nature and character of the invention as it is claimed. The accompanying drawings are included to provide further understanding of the invention, illustrate various embodiments of the invention, and together with the description serve to explain the principles and operation of the invention.

BRIEF DESCRIPTION OF THE DRAWINGS

The invention will now be described in a non-limiting manner in its two aspects of a method and a device, with reference to the accompanying figures.

DETAILED DESCRIPTION OF THE PREFERRED EMBODIMENT

Figure 1:
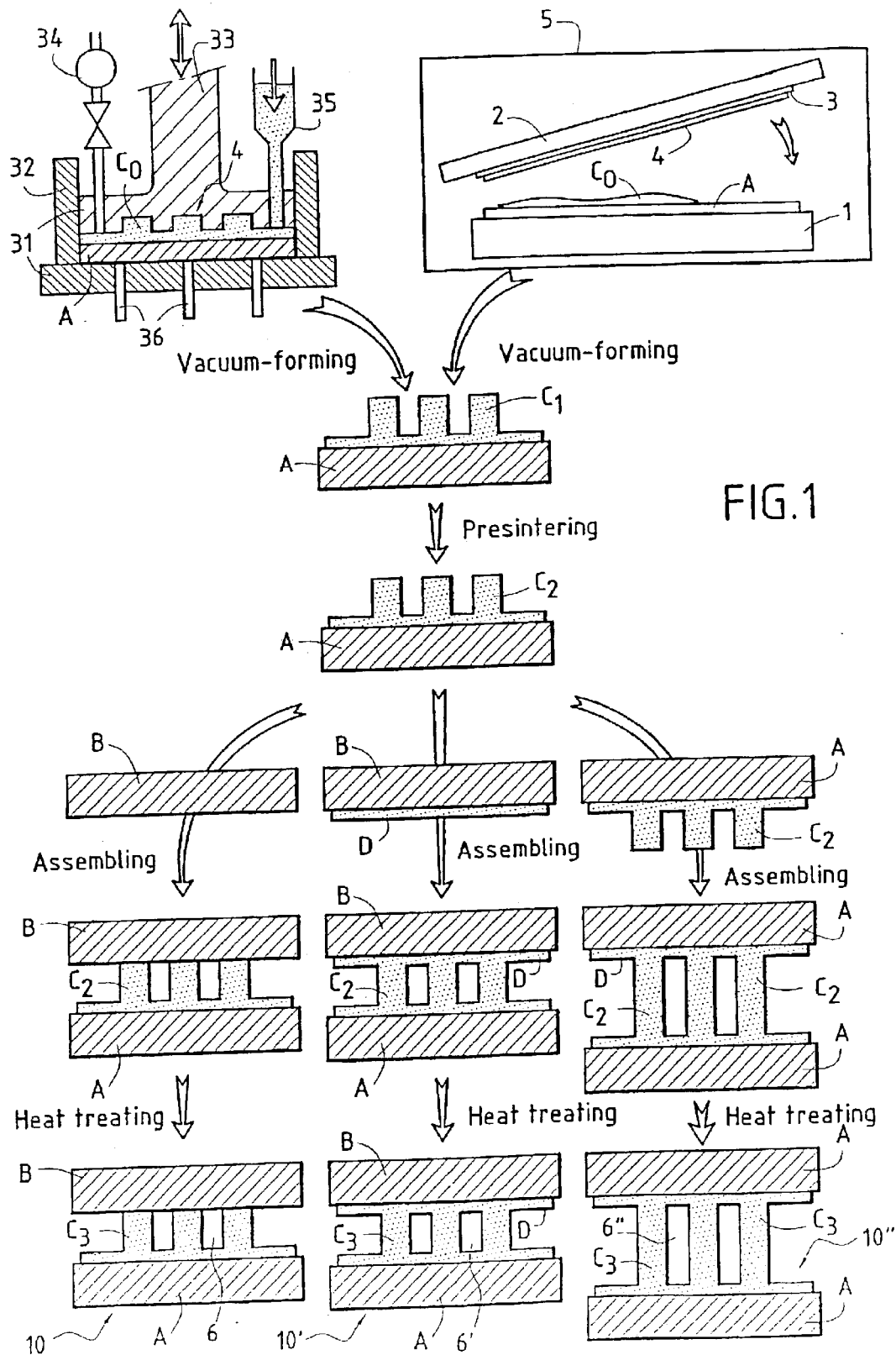
FIG. 1 schematically illustrates the various steps of a preferred method of the present invention and depicts, likewise diagrammatically, the various intermediate products that are precursors for devices of the present invention, and also the end products, namely devices of the present invention. Three exemplary embodiments of the method, enabling three different exemplary embodiments of single-element devices made by the method are also shown.

As will be described in greater detail below, microfluidic devices of the present invention are original by their particular structure (of the sandwich type) by the materials constituting them, and by the particular method used to manufacture them, which is preferably based on a vacuum-forming technique. The method of the present invention, moreover, is original and particularly advantageous in that it implements first, vacuum-forming (e.g. micromolding in a vacuum), and second, presintering. Unlike other methods, it also makes use of substrates or supports.

Referring now to the first aspect of the present invention, i.e. original microfluidic devices, such microfluidic devices are preferably closed (with a "cover plate"), and depending on the embodiment concerned may exist singly (n=1) or in combinations of a plurality of devices (n>1).

A microfluidic device of the invention includes at least one element (n≧1) (in particular it can consist of a single element or of a set of such elements assembled together (where each element of the assembly can be referred to as a module or a stage), or indeed a composite assembly comprising at least one such element and at least one element of another type) which includes those, heat-sealed between two substrates, a one-piece microstructure (hence a "sandwich" type structure) in which at least one recess is formed (of the channel, distribution chamber, or (chemical, biological, electrochemical) reaction chamber type); each recess of a microstructure of an element communicating with at least one other recess of the microstructure of the element or of another microstructure of another element of the device (which then includes n>1 elements), and/or with the outside of the device so that within the device of the invention there is to be found at least one (liquid or gaseous) fluid circulation circuit communicating with the outside via at least one inlet and one outlet.

The substrates of the component element(s) of the device of the invention are may be manufactured from materials selected from glasses, glass ceramics, ceramics, metals, semiconductors such as silicon, and/or combinations thereof.

The one-piece microstructure(s) preferably sandwiched between such substrates is/are made of at least one material selected from glasses, glass ceramics, ceramics and combinations thereof.

The materials involved with contact between the above-listed materials or precursors for the materials (in particular glass frit) are compatible in terms of thermal expansion coefficients. As will be described in greater detail below, this, among other things, may be done to avoid any cracking, firstly during cooling after hot-forming and firing of the final assembly and secondly while the device is in use.

A person skilled in the art will readily understand much of the benefit of devices of the invention. Within such devices, the fluids involved may come into contact only with surfaces that are under complete control. These may include surfaces of the material from which the one-piece microstructure is made (glass(es), glass ceramic(s), ceramic(s)), or surfaces of the material after modification. It is typically easy to modify such surfaces as they may be made active in certain contexts, for example by depositing a catalyst, and in other contexts they may be made completely neutral, for example by covering them in particular in a film of polysiloxane. From this point of view, devices of the invention provide much better performance than known devices made of polymer or of metal. Furthermore, the structure of devices of the present invention is reinforced by the presence of the substrates.

It is explained below that these characteristics concerning the structure and the nature of the component materials are also advantageous in terms of the method of manufacturing such devices.

Devices of the invention may exist in numerous variants, implemented homogeneously or otherwise when a plurality of elements are involved in their structure. The one-piece microstructure between the two substrates (which can be identical or different in nature) of each element may themselves be implemented in a plurality of variants. For example, the device of the invention can consist in a single element (n=1) of the kind characterized above. The device of the invention may consist in a plurality of elements (n>1) as characterized above, which elements may optionally be identical, and are preferably secured to one another. In particular, two elements may be secured to each other by using a common substrate, as when they are prepared conjointly or by using a joining material (e.g. an adhesive) that withstands the temperatures at which the device is used. They may then be prepared in advance independently of each other.

When a device of the invention includes more than two elements (n>2), the elements may be all secured to one another using the first above-described technique, all secured to one another using the second above-described technique, or at least two of them may be secured to each other using the first technique and at least two of them my be secured to each other using the second technique. Thus, the microfluidic device of the invention may include, a single element, a plurality of elements, with at least two of the elements being secured to each other via a common substrate and/or with at least two of the elements being secured to each other via their respective substrates (using a joining material between the substrates).

The device of the invention, whether it has one or more elements, generally presents at least one element within which both substrates are disposed in a substantially parallel manner. Advantageously, all of the substrates of the assembly, having one or more elements, are disposed so as to be substantially parallel. Nevertheless, it is not in any way impossible for the structure of devices of the invention to include facing element substrates that are not substantially parallel.

The device of the invention may also include at least one element having at least one porous substrate and/or a one-piece microstructure that is porous. It can be desirable for the material constituting the substrate(s) to be porous in order to perform separation within the device, or it can be desirable for the material constituting the one-piece microstructure to be porous in order to fix a catalyst, in order to perform a chemical reaction, in order to separate fluids, or in order to perform filtering.

In general, devices of the invention include appropriate passages for inlet and outlet of the fluid(s) that is/are to flow within them, which passages are formed through their end substrates and/or through the end one-piece microstructures. Nevertheless, it is not impossible for the fluid inlet and/or outlet to be provided directly via one of the recesses in the one-piece structure opening out directly to the outside.

Assuming that the device of the invention includes a plurality of elements, at least one passage can be provided through at least one substrate to provide communication between microstructure recesses situated on opposite sides of said substrate. The recesses performed within the one-piece microstructure of each element can be of arbitrary section. Accordingly, they may have sections with numerous angles, thus being substantially square, rectangular, hexagonal or otherwise including planar surfaces, they may have sections with few angles, thus being substantially semicircular or otherwise including only curved surfaces and planar surfaces, or they can have sections without angles, being substantially circular or otherwise including only curved surfaces. Advantageously they present sections without angles, so that the circulation of fluids (particularly liquids) within them may be optimized. Most advantageously, all of them present such sections without angles. In any event, said recesses are advantageously of controlled shape. This provides definite advantages in terms of predicting the behavior and/or the reactions of fluids within the device by methods based on modeling the flow of the fluids.

The recesses in question may be defined by blocks of the material(s) constituting the microstructure that are entirely suitable for treating as though they are walls. Such walls can be of constant thickness or otherwise, and in particular their thickness can be constant, tapering, or flaring (going away from one of the substrates between which the microstructure is located).

In the context of advantageous exemplary embodiments of devices of the invention, the microstructure(s) between the substrates is/are preferably highly perforated, the total volume of the recesses (i.e. the empty percentage of the microstructure(s)) then being large. The empty percentage is advantageously typically greater than 50% (said percentage naturally being a volume percentage). Moreover, the microstructure(s) between the substrates present(s) walls between the recesses having height/thickness ratios (aspect ratios) preferably greater than 1, and advantageously on the order of about 3 to 4, and most advantageously greater than about 6. It has been possible to obtain aspect ratios greater than or equal to approximately 10. Such aspect ratios generally cannot be obtained by isotropic chemical etching. Naturally, devices having the above-specified characteristics form an integral part of the invention even if they have a smaller percentage of empty volume than specified and/or even if the microstructure(s) present(s) aspect ratios of less than 1.

The basic module or element of a microfluidic device of the invention (single element, elements repeated n times, identically, or with variants) is thus characteristically a ternary structure including a hollowed-out one-piece microstructure between two substrates. As mentioned above, the ternary structure, substrate plus one-piece microstructure plus substrate, may be functionalized by suitably porous materials, by surface treatment, or otherwise as is known in the art. For this purpose it can also include functionalization by the use of additional parts such as electrical conductors, electrodes, light conductors, and the like. Such parts can be used as heater mechanisms, sensors, and the like.

Two additional parts may be incorporated in the ternary structure while it is being made, and are generally incorporated in the one-piece microstructure, optionally in contact with one of the substrates, and optionally opening out into a recess. They may also be arranged in intermediate layers provided between a substrate and a one-piece microstructure. One or more such intermediate layers may preferably be included Devices of the invention may thus include at least one element containing at least one additional part, for example a light conductor, an electrical conductor, an electrode, and/or it can have at least one recess in the one-piece microstructure whose surface has been modified.

A second aspect of the present invention is described, in general, below. More specifically, a method of manufacturing microfluidic devices, such as those described above, and having at least one element preferably includes the steps of, forming, under a vacuum (to avoid trapping any bubbles of gas), a first mixture of an organic medium and a material that is a precursor for glass, glass ceramic, ceramic, or a combination thereof, on a first substrate made of a material selected from glasses, glass ceramics, ceramics, metals, semiconductors such as silicon or combinations thereof. The precursor material concerned is preferably compatible in terms of thermal expansion coefficient with the material constituting the first substrate. The vacuum-forming is preferably implemented under conditions which confer at least a minimum amount of mechanical strength to the shapes generated.

The formed mixture is then preferably presintered by applying appropriate heat treatment to the assembly including the first substrate and the formed mixture (the presintering serves to eliminate the organic medium and to consolidate the structure). A second substrate made of a material selected from glasses, glass ceramics, ceramics, metals, semiconductors such as silicon or combinations thereof is then preferably applied, which material may be identical or different from that of the first substrate, the material being compatible in terms of thermal expansion coefficient with substantially all of the precursor materials with which it may come into contact. The second substrate being involved may be either untreated, coated on one of its faces with a second mixture of a thermoplastic medium and a material that is a precursor for glass, glass ceramic, ceramic, or a combination thereof, which mixture is optionally identical to that used on the first substrate, is not vacuum-formed, is optionally presintered, and in any event is compatible with the second substrate and with the first mixture, or indeed coated on one its faces with such a second mixture which has previously been vacuum-formed and presintered in succession. The two substrates may then be assembled together such that the mixtures optionally present on each of the substrates face each other. Although not required, the above operations may optionally be repeated at least once either identically or with variations concerning the nature of the second substrate, using the assembly that has already been obtained as the bottom or top portion of a structure that includes, in succession, two, three, and/or more stages. The resulting assembly, having one or more stages, may then be heat treated (fired) so as to bond together the precursor material (s) and the substrates, or so as to bond the different precursor materials together and to each of the substrates on which they have been deposited.

The vacuum-forming can be implemented in various different ways, in particular taking account of the nature of the organic medium mixed in the precursor material. The organic medium in the mixture can be constituted, in particular, by a thermoplastic medium, a thermosetting medium, or a photopolymerizable medium.

Generally speaking, the method may be initiated in one or more of the following ways. The first mixture may be placed on the first substrate prior to application of the mold in the forming operation (in a vacuum enclosure) or the mold may initially be placed on the first substrate, a vacuum established, and then the mixture injected therein. If a thermoplastic medium is used in the mixture, then the mixture may preferably be initially heated, shaped with an appropriate mold, and allowed to cool, after which the mold may be removed. If the medium is a thermosetting medium, then the mixture may be formed at ambient temperature with an appropriate mold, heated once it has been formed, cooled, and then the mold may be removed. If the medium is a photopolymerizable medium, then the mixture may be formed at ambient temperature with an appropriate mold. Once it has been formed, it may be exposed to appropriate radiation (light, X-rays), after which the mold may be removed. As one of skill in the art will recognize, molds used may be prepared and adapted to the desired final shape from suitable master molds, in conventional manner.

Vacuum-forming generates shapes in relief in the mixture of precursor medium and organic material. In characteristic manner, according to the invention, the shapes are obtained by deforming the mixture while it is supported on a substrate. The substrate is preferably not subjected to any etching.

Since the presintering is preferably performed on a structure that is supported, it is simple to perform and the structure retains its planeness. Presintering serves to eliminate a major portion of the organic components from the mixture prior to assembly (prior to closing the structure). Eliminating volatile components from a complex three-dimensional structure is always a problem, since the gases must be able to escape without damaging the structure. The use of substrates made of glass, glass ceramic, ceramic, metal, or semiconductor is particularly advantageous in that, sub-structures can be formed easily without the need to produce and handle such sub-structures in a self-supporting configuration which would be fragile, the structures do not sag or become distorted, thus making it possible to provide ribs that are far apart and/or wall shapes that are complex, and it is easy to introduce additional parts such as electrical conductors, electrodes, or light conductors on the substrates with the mechanical behavior of the parts being good.

In conventional manner, presintering is generally implemented after a material that is inert relative to the precursor material, and that absorbs the organic medium has been applied to the formed mixture. This minimizes the extent to which the formed mixture sags or collapses. The absorbent material is generally powdered or sprayed onto the formed mixture for presintering.

When operations are not repeated, the method of the invention makes it possible to provide a single stage device (by assembling together first and second substrates; one of the substrates then acts as a bottom while the other acts as a cover plate). When operations are repeated, the method makes it possible to provide a device comprising n stages, using one or more common substrates. Such one or n stage devices can then be secured to one another by using a joining material, in particular an adhesive. Devices of the invention having one stage, n stages with common substrates, n stages stuck to one another (no common substrate), or n stages, some of them having common substrates and some of them having no common substrate, can all be used in a vertical position, in a horizontal position, in an inclined position, or in some other orientation known in the art.

The method of the invention for obtaining any element of the final device can be implemented in three main variant manners according to the type of cover plate involved. As mentioned above, the second ($n^{th}$) substrate can be applied to the presintered mixture of the first ($n-1^{th}$) substrate, untreated, (although this variant is not preferred, it is certainly not excluded), coated with an optionally presintered second mixture, the second mixture is preferably in the form of a uniform layer that has not been shaped, it can optionally be presintered and if it has not been presintered, then contact with the presintered first mixture is improved, and coated with a second mixture that has been vacuum-formed and presintered (like the first mixture). This exemplary implementation is advantageously performed with the two substrates in alignment in order to take advantage of the complementary shapes formed as recesses in the mixtures. This makes it possible in microfluidic devices of the invention to obtain significant aspect ratios, which ratios can be greater than 10.

In addition to the steps described above, the method of the invention can include additional steps. Passages may be provided by drilling to allow fluid circulation, to allow such fluids to enter and leave, or indeed to allow them to pass from a recess in one element to a recess in another element. Drilling operations may also be performed on parts that are to be assembled together, advantageously through the presintered mixtures. In addition, one or more additional parts can be inserted, in particular parts of the type specified above (electrical conductors, electrodes, light conductors) on one of the substrates involved and/or in the precursor mixture involved, or indeed in an intermediate layer that is inserted between at least one of the first and second substrates and the corresponding first or second mixture. During manufacture of each of the elements of the device of the invention it is entirely possible to slide at least one intermediate layer (a fine layer of Si, a layer of glass, of ceramic, or glass ceramic) between a substrate and the precursor mixture for generating a portion of the one-piece microstructure, in particular, electrodes that can be formed by conventional printing, photolithography, or electroforming techniques. Actions can also be taken on the inside surfaces of the recess in the one-piece microstructure. This may be done for the purpose of depositing a catalyst, laying a film, or a coating, for example. In other words, chemical or physical treatment can be applied to the surfaces which are to come into contact with the fluids.

Reference will now be made in detail to the present preferred embodiments of the invention, examples of which are illustrated in the accompanying drawing figures. Wherever possible, the same reference numerals will be used throughout the drawings to refer to the same or like parts.

Exemplary embodiments of a method of manufacturing a microfluidic device in accordance with the present invention is shown in FIG. 1.

Initially and in a preferred embodiment, microstructures in relief are made on a substrate A (e.g. of glass or of silicon) with said microstructures being made by molding a mixture $C_0$ comprising glass frit and a thermoplastic medium (for example). Two different techniques are shown diagrammatically. The technique in the upper right corner of FIG. 1 is similar to the technique described in U.S. Pat. No. 5,853,446, and more particularly to the method described in Example 4 of that patent. In accordance with the method, mixture $C_0$ is deposited on the substrate A. Substrate A carrying the mixture is placed on a thermostatically controlled support 1. A suitable mold made of elastomer 4 is prepared in advance. The mold is positioned on a support 3, which is itself secured to a heater element 2. The assembly comprising elements 2, 3, and 4 is degassed in a vacuum inside the enclosure 5 prior to being applied to the mixture $C_0$ in the enclosure. Such degassing preferably degasses the mixture $C_0$ and prevents any bubbles of gas from being trapped in the formed mixture.

The method in the upper left corner of FIG. 1 is based on injecting mixture $C_0$ into the mold 4 after it has been placed in advance on the substrate A. The assembly including the substrate A and the mold 4 is positioned between two hot plates 31 inside a jacket 32 suitable for opening and closing under the action of a piston 33. After the inside of the mold 4 has been evacuated by an evacuation mechanism 34, the mixture $C_0$ is injected through the an injector 35. At the end of the thermoforming process, the thermoformed assembly is ejected using ejector mechanism 36 acting through the bottom hot plate.

After the vacuum-forming step has been implemented, a mixture $C_1$ is obtained that is secured to substrate A, which mixture includes mixture $C_0$ that has been thermoformed. The assembly is then subjected to heat treatment so that mixture $C_1$ is presintered. It is then referenced $C_2$ and consists mainly of heat-treated glass frit.

In parallel, a cover plate is prepared for the intended device. In a first embodiment, the cover plate includes a substrate B (optionally identical to substrate A) which is placed untreated on $C_2$. The assembly is then subjected to heat treatment under suitable conditions to cause the three components of the resulting microfluidic device 10, i.e. the substrates A and B with the fired one-piece microstructure $C_3$ between them, to be securely united. Generally speaking, the microstructure preferably includes recesses 6.

In a second embodiment, the cover plate includes a substrate B (optionally identical to the substrate A) coated in a uniform layer of a mixture D of glass frit and a thermoplastic medium (for example). Mixture D is optionally presintered. It therefore optionally includes significant quantities of thermoplastic medium. The resulting assembly is subjected to heat treatment under appropriate conditions for generating a microfluidic device 10' in accordance with the invention. Its microstructure $C_3$ plus D contains the recesses 6'.

In a third embodiment, the cover plate is of the same type as the bottom plate. It includes a substrate (the same substrate as A in the example shown) having a presintered thermoformed mixture secured thereto (the same mixture $C_2$ in the embodiment shown). Thus, by placing the patterns in relief so that they are in register with each other, it is possible to obtain recesses 6" of large volume (and presenting significant aspect ratios). The resulting assembly is subjected to heat treatment under suitable conditions to generate a microfluidic device 10" of the invention.

Figure 2A:
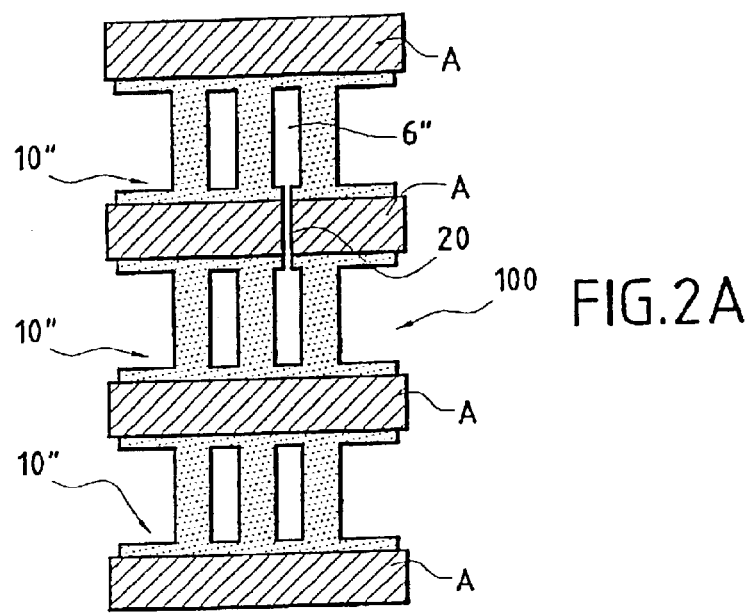
FIGS. 2A and 2B depict exemplary devices of the invention built up from a plurality of elements.

To obtain the microfluidic device 100 that is shown in section in FIG. 2A, which device includes three stages, three devices 10" are prepared in succession. The three devices 10" are not prepared independently, since the top substrate of the first stage constitutes the bottom substrate of the second stage, and the top substrate of the second stage constitutes the bottom substrate of the third stage. The assembly is built up stage by stage and then the final assembly is fired. A passage 20 is provided between one of the recesses in the second stage and one of the recesses in the third stage.

Figure 2B:
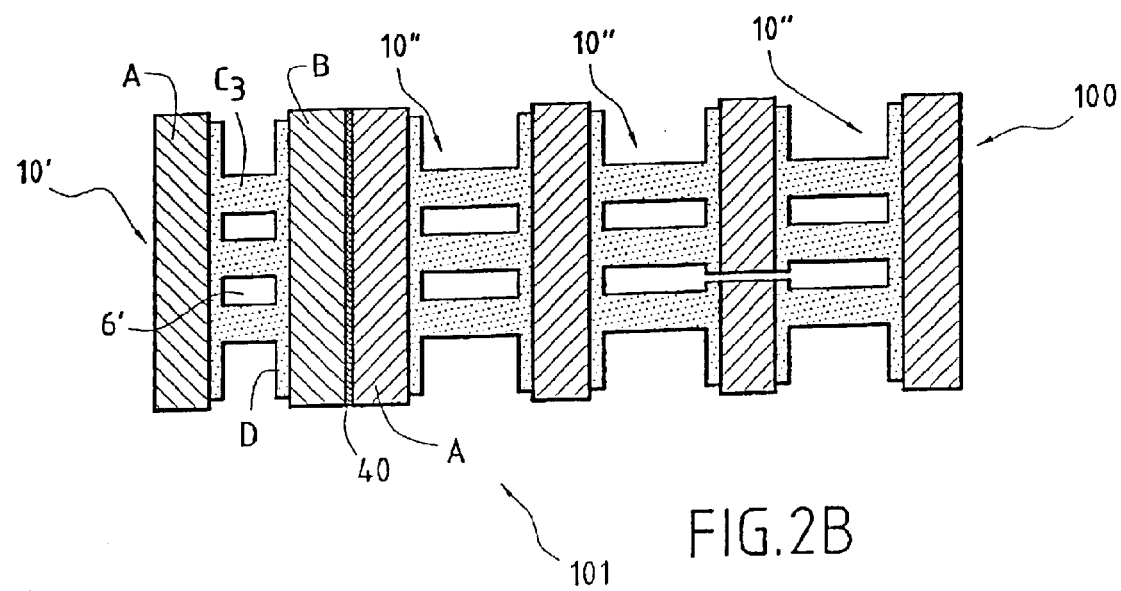

FIG. 2B is a section showing a device 101 of the invention that has four stages (10'+10"+10"+10") which are in horizontal alignment. The device 101 is obtained from a three-stage device 100 (10"+10"+10") as shown in FIG. 2A plus a single-stage device 10' as shown in FIG. 1. Devices 100 and 10' are preferably connected together by adhesive. The joint of adhesive material is given reference 40. Device 101 thus presents a "composite" type of structure (i.e. with assembly by means of a common substrate, and with assembly by means of two substrates, all in the same structure).

Figure 3:
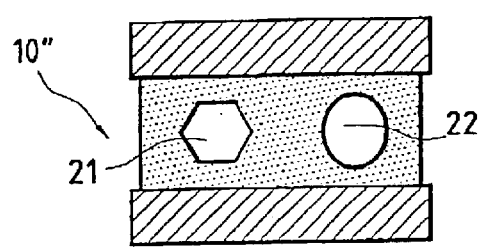
FIGS. 3, 4, and 5 schematically depict various exemplary devices of the invention each including a single element.

FIG. 3 is a section view of a single-element device of the invention of the 10" type. The technique used makes it possible to generate advantageous shapes for the recesses 21 and 22. The first recess, 21, is substantially hexagonal in section while the second recess, 22, is substantially circular in section. Such a section having no angles is particularly advantageous.

Figure 4:
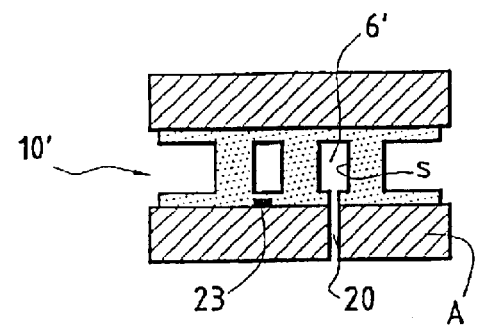

FIG. 4 is a section showing a single-element device of the invention of the 10' type. Its structure includes a passage 20 and an electrical conductor 23. The electrical conductor 23 is positioned on the bottom substrate A before depositing the mixture $C_0$. By using suitable treatment, the surface(s) of the recess 6' is modified. The device is preferably fed with fluid via the passage 20.

Figure 5:
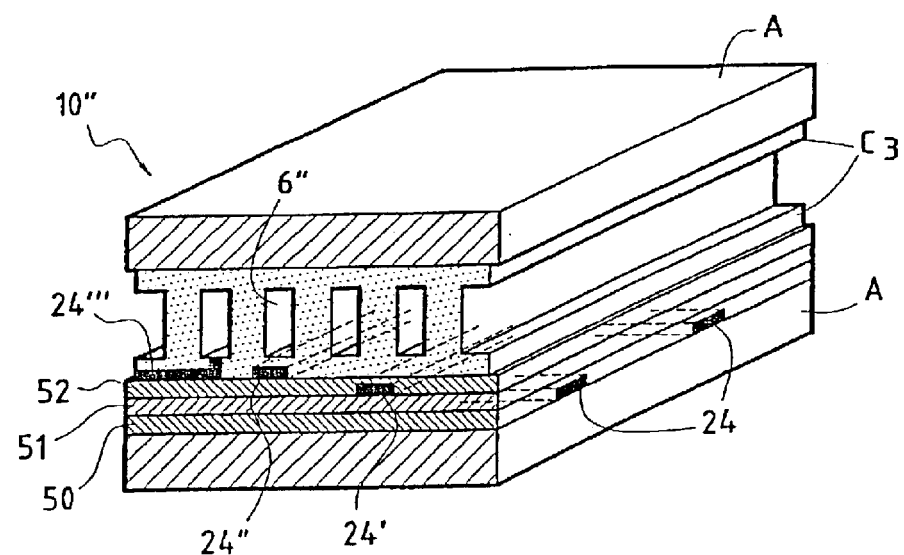

FIG. 5 is a perspective view of a single-element device of the invention of the 10" type. The device nevertheless also includes three intermediate layers 50, 51, and 52 between the substrates A and the one-piece microstructure $C_3$. These intermediate layers 50, 51, and 52 are involved with additional parts 24, 24', 24", and 24''' of the type including electrodes and light conductors. The parts 24 of the first layer 50 are disposed perpendicularly to the parts 24' and 24", respectively, in the third layer 52, and on the third layer 52. The part 24" lies on the third layer 52 in the microstructure $C_3$. The part 24''', e.g. of the sensor type, opens out into the recess 6".

EXAMPLE

The invention is illustrated by the following example:

Microreactors of the 10' type (as shown diagrammatically in FIG. 4) were made using a baseplate of alkali-lime type glass on which electrodes were deposited (which electrodes can be used for local heating, for temperature control, or as probes). The thickness of the first substrate should be at least 200 μm, and should generally lie in the range of about 200 μm to about 3 millimeters (mm). Structures in relief were formed on the glass plate by microforming glass, the structures having a width lying in the range of about 100 μm to about 300 μm and a height of up to approximately 800 μm; the widths of the resulting capillaries (i.e. recesses) lay in the range of about 50 μm to more than about 1000 μm. Passages were drilled in the appropriate locations to put recesses of the device into communication with the outside. Thereafter, a cover plate of alkali-lime glass was put into place on the drilled glass plate (the cover plate constituting a second substrate and likewise having a thickness of at least about 200 μm, and generally lying in the range of about 200 μm to about 3 mm). The cover plate was covered in a smooth layer of glass substantially identical to the glass used on the baseplate. The assembly was heated to seal the recesses of the structure.

More specifically, the following steps were performed in succession:

First Step: Provision of a Suitable Mold.

In this example, a mold was made of flexible silicone (RTV 141). To make such a mold, it was necessary to have a master mold of metal, polymer or glass, for example (the master mold itself being obtained by a method such as mechanical machining, electro-erosion, stereolithography). The particular master mold used was made by photolithography using a thick SU8 photo resist.

Second Step: Preparing the First Glass Precursor Mixture.

The first mixture included glass frit (VR 725 from CERDEC) and a thermoplastic medium (MX 4462 from CERDEC) with an inorganic over organic ratio greater than about 4 by weight. It was obtained merely by mixing.

Third Step: Making Electrodes on the First Substrate.

The first substrate (baseplate) was selected to have a softening temperature higher than that of the glass frit (VR 725). The electrodes were made by silk-screen printing a silver paste (CERDEC Ref. 7435) in the selected pattern. The deposited paste was presintered at approximately 500° C.

Fourth Step: Forming the First Mixture.

The first mixture was deposited on the glass baseplate at a temperature of about 100° C. The silicone mold was also maintained at about 100° C. It was positioned facing the plate. The assembly was then placed in a vacuum. The mold was applied to the first mixture with a force of about 0.1 kilograms per square centimeter (kg/cm²). The assembly was then allowed to cool to ambient temperature, and the silicone mold was peeled off.

Fifth Step: Making the Cover Plate.

A layer of about 10 μm to about 50 μm of a second mixture was spun-coated onto a plate of alkali-lime glass. The second mixture was likewise glass frit (VR 725) and a thermoplastic medium (MX 54 from CERDEC).

Sixth Step: Presintering.

The thermoplastic media were eliminated from the baseplate and the cover plate by heat treatment. The heat treatment was implemented at 500° C. in a kiln. The temperature cycle was as follows:

2 hours (h) temperature rise from about 20° C. to about 500° C.;

1 h steady at about 500° C.; and 2 h temperature reduction from about 500° C. to about 20° C.

In conventional manner, the structures were prevented from collapsing during the temperature rise. An absorbent material that does not react with glass frit, such as alumina powder was dusted onto the structures. This can be done, for example, in the manner described in Example 4 of U.S. Pat. No. 5,853,446.

Seventh Step: Drilling.

The drilling was performed conventionally, using diamond drill bits. Bit diameter was naturally the same as the diameter desired for the various passages. This diameter generally lies in the range of about 0.5 mm to about 3 mm.

Eighth Step: Assembly and Firing

The cover plate was placed on the baseplate (the baseplate could equally well be placed on the cover plate). Glass-glass bonding was achieved by subjecting the assembly to the following temperature cycle:

2 h temperature rise from about 20° to about 550° C.;

20 minutes (min) steady at about 550° C.;

10 min temperature drop from about 550° C. to about 500° C.; and 2 h temperature drop from about 500° C. to about 20° C.

While the invention has been described in detail, it is to be expressly understood that it will be apparent to persons skilled in the relevant art that the invention may be modified without departing from the spirit or scope of the invention. Various changes of form, design, or arrangement may be made to the invention without departing from the spirit and scope of the invention. Therefore, the above-mentioned description is to be considered exemplary, rather than limiting, and the true scope of the invention is that defined by the following claims.

What is claimed is:

1. A method of manufacturing a microfluidic device, the method comprising the steps of:

shaping a mixture including a binder and a precursor material on a first substrate;

presintering the mixture and the substrate to remove the binder and form a consolidated first assembly;

assembling the first assembly with a second assembly comprising a second substrate such that the presintered mixture is positioned between the first substrate and the second assembly; and heating the assembled first assembly and second assembly to a temperature sufficient to form a one-piece microstructure defining at least one recess between the first and second substrates.

2. The method of claim 1 wherein the step of shaping the mixture on the first substrate includes placing a mold on the first substrate.

3. The Method of claim 2 wherein the step of shaping the mixture on the first substrate further includes injecting the mixture into the mold.

4. The Method of claim 3 wherein the step of shaping the mixture on the first substrate further includes establishing a vacuum between the mold and the first substrate before injecting the mixture into the mold.

5. The method of claim 1 wherein the second assembly further comprises a uniform layer of a mixture including a binder and a precursor material applied to the second substrate and wherein the assembling step comprises the step of affixing the uniform layer of the mixture to the presintered mixture.

6. The method of claim 1 wherein the second assembly further comprises a presintered shaped mixture secured to the second substrate and wherein the assembling step comprises the step of positioning the presintered mixture of the first assembly adjacent the presintered mixture of the second assembly.

7. The method of claim 1 further comprising the step of drilling at least one passage to provide communication between the outside and the at least one recess.

8. The method of claim 1 further comprising the step of repeating the shaping, presintering, assembling, and heating steps to form a plurality of one-piece microstructures and joining the plurality of one-piece microstructures such that they have at least one substrate in common.

9. The method of claim 1 further comprising the step of positioning a part selected from the group consisting essentially of electrical conductors, electrodes and light conductors on an intermediate layer positioned between the first substrate and the mixture.

10. The method of claim 1 wherein the binder is an organic binder.

11. A microfluidic device made by the process claimed in claim 1.

* * * * *